US012770831B2

(12) United States Patent
Iwanami et al.

(10) Patent No.: US 12,770,831 B2
(45) Date of Patent: Oct. 20, 2026

(54) ION SOURCE AND OPERATING METHOD THEREOF

(71) Applicant: NISSIN ION EQUIPMENT CO., LTD., Koka-city (JP)

(72) Inventors: Yuta Iwanami, Koka-city (JP); Yuya Hirai, Koka-city (JP); Suguru Itoi, Koka-city (JP); Weijiang Zhao, Koka-city (JP)

(73) Assignee: NISSIN ION EQUIPMENT CO., LTD., Koka-city (JP)

( * ) Notice: Subject to any disclaimer, the term of this patent is extended or adjusted under 35 U.S.C. 154(b) by 500 days.

(21) Appl. No.: 18/361,160

(22) Filed: Jul. 28, 2023

(65) Prior Publication Data

US 2024/0038499 A1 Feb. 1, 2024

(30) Foreign Application Priority Data

Aug. 1, 2022 (JP) ................................ 2022-122482

(51) Int. Cl.
*H01J 37/32* (2006.01)
*C23C 14/48* (2006.01)

(52) U.S. Cl.
CPC ........ *H01J 37/32412* (2013.01); *C23C 14/48* (2013.01); *H01J 37/3244* (2013.01); *H01J 37/32724* (2013.01)

(58) Field of Classification Search
None
See application file for complete search history.

(56) References Cited

U.S. PATENT DOCUMENTS 5,306,921 A * 4/1994 Tanaka .................... H01J 27/08 315/111.41
7,084,408 B1 * 8/2006 Kimball .................. C23C 14/48 250/424
2003/0230986 A1 * 12/2003 Horsky ............... H01J 37/3171 315/111.81
2005/0274903 A1 * 12/2005 Goldberg ................ H01J 37/08 250/423 R
2020/0135433 A1 * 4/2020 Kim .................. H01J 37/32449
2023/0326702 A1 * 10/2023 Hahto ..................... H01J 37/08 250/423 R
2023/0395357 A1 * 12/2023 Wright .................... C23C 14/48
2024/0030004 A1 * 1/2024 Iwanami ................. H01J 37/08

FOREIGN PATENT DOCUMENTS

JP 08-36983 A 2/1996

* cited by examiner

*Primary Examiner* — Sylvia Macarthur
*Assistant Examiner* — Michelle Crowell
(74) *Attorney, Agent, or Firm* — Sughrue Mion, PLLC

(57) ABSTRACT

An ion source includes a vaporizer, a plasma chamber, and a controller. The vaporizer produces a reaction product by supplying, through a first gas supply line to a crucible in which a solid material is installed, a reactive gas that reacts with the solid material, and vaporizes the reaction product by heating the crucible with a heater. The plasma chamber is supplied with a vapor from the vaporizer through a vapor supply line, and has a second gas supply line connected to the plasma chamber separately from the vapor supply line. The controller controls the heater to heat the crucible while a gas is being supplied from the second gas supply line to the plasma chamber and stops a supply of the reactive gas through the first gas supply line to the crucible.

13 Claims, 5 Drawing Sheets

ION SOURCE AND OPERATING METHOD THEREOF

CROSS-REFERENCE TO RELATED APPLICATION

This application claims priority from Japanese Patent Application No. 2022-122482, filed in the Japanese Patent Office on Aug. 1, 2022, the entire contents thereof being herein incorporated by reference in its entirety.

BACKGROUND

The present disclosure relates to an ion source used in an ion beam irradiation apparatus and an operating method of the ion source.

In an ion implanter, an ion species is switched depending on a kind of ion implantation process performed by the ion implanter. When the ion species is switched, the type of gas or vapor to be introduced into a plasma chamber is switched. A plasma is generated in the plasma chamber from the switched gas or vapor each time the type of gas or vapor is switched. An ion beam is then extracted from the generated plasma with a desired beam energy.

Some ion implanters may include ion sources having an oven for a solid material. In this ion implanter, it takes time to switch the ion species, and thus frequent switching of the ion species deteriorates a productivity of the ion implanter.

SUMMARY

It is an aspect to make it possible to reduce a time required for switching an ion species.

According to an aspect of one or more embodiments, there is provided an ion source comprising a vaporizer which produces a reaction product by supplying, through a first gas supply line to a crucible in which a solid material is installed, a reactive gas that reacts with the solid material, and which vaporizes the reaction product by heating the crucible with a heater; a plasma chamber to which a vapor is supplied from the vaporizer through a vapor supply line, a second gas supply line being connected to the plasma chamber separately from the vapor supply line; and a controller that is configured to control the heater to heat the crucible while a gas is being supplied from the second gas supply line to the plasma chamber and to stop a supply of the reactive gas through the first gas supply line to the crucible.

According to another aspect of one or more embodiments, there is provided an operating method for an ion source comprising a vaporizer that produces a reaction product by supplying, though a first gas supply line to a crucible in which a solid material is installed, a reactive gas that reacts with the solid material, and vaporizes the reaction product by heating the crucible with a heater, a plasma chamber to which a vapor is supplied from the vaporizer through a vapor supply line, a second gas supply line being connected to the plasma chamber separately from the vapor supply line, the operating method comprising heating the crucible by the heater while a gas is being supplied from the second gas supply line to the plasma chamber, and stopping supply of the reactive gas through the first gas supply line to the crucible.

According to yet another aspect of one or more embodiments, there is provided an ion source comprising a vaporizer including a crucible containing a solid material which reacts with a reactive gas which, when heated, generates a vapor; a heater configured to heat the crucible; a plasma chamber communicatively connected to the vaporizer by a vapor supply line and configured to generate a plasma from the vapor or from a source gas supplied thereto; a source gas supply line communicatively connected to the plasma chamber and through which the source gas is supplied to the plasma chamber; a reactive gas supply line communicatively connected to the vaporizer through which the reactive gas is supplied to the vaporizer; and a controller that is configured to control the heater to heat the crucible while supplying the source gas to the plasma chamber through the source gas supply line, and to switch a source of the plasma from the vapor to the source gas by stopping the reactive gas from being supplied through the reactive gas supply line to the crucible.

BRIEF DESCRIPTION OF THE DRAWINGS

The above and/or other aspects will become apparent and more readily appreciated from the following description of embodiments, taken in conjunction with the accompanying drawings, in which.

DETAILED DESCRIPTION

As described above, in an ion implanter, the ion species are switched depending on a kind of ion implantation process. When the ion species is switched, the type of gas or vapor to be introduced into a plasma chamber is switched. A plasma is generated in the plasma chamber for each of the switched gas or vapor. An ion beam is extracted from the generated plasma with a desired beam energy.

Some ion sources include an oven for a solid material. In this ion source, a gas from a gas source and a vapor from an oven are selectively supplied to a plasma chamber as a source of plasma. After the source of plasma is switched from vapor to gas, a heater of the oven is turned off. However, the oven is heated by radiation heat from the plasma chamber. As a result, even though the oven is turned off, a vapor may still be released into the plasma chamber and mix with the gas supplied from the gas source.

As a countermeasure, the oven temperature may be kept at a low temperature using a cooling mechanism so that heat from the plasma chamber is not transferred to the oven and vapor is not supplied from the oven while the plasma is generated based on gas from the gas source.

However, the countermeasure has a disadvantage in a switching time of the ion species increases. The oven temperature is switched from low to high temperature or from high to low temperature so that the oven temperature may reach a predetermined temperature when switching the ion species. Oven temperature control is time-consuming, and this increased time is said to be the cause of prolonged switching of ion species.

Since the time required for oven temperature control increases according to the number of times the ion species is switched, frequent switching of ion species decreases the productivity of the ion implanter.

Figure 1:
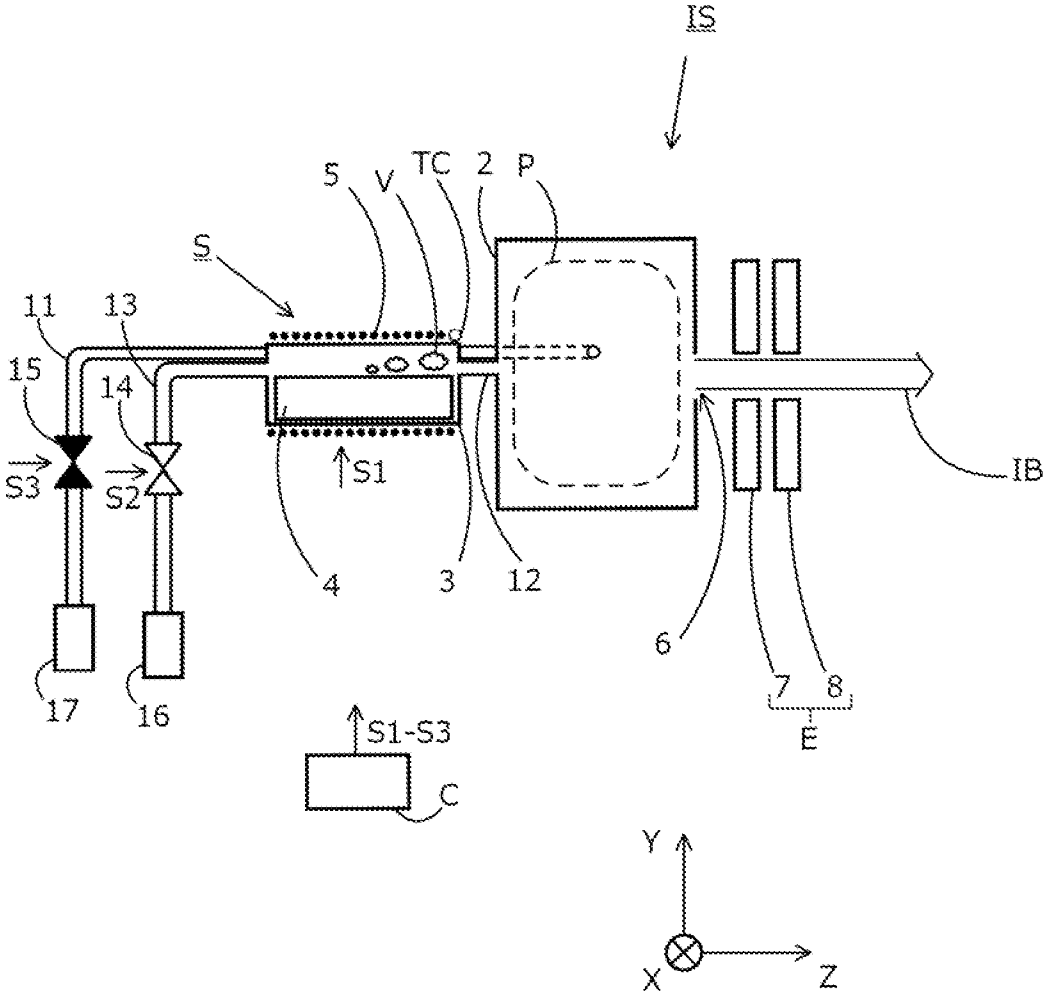
FIG. 1 is a schematic cross-sectional diagram showing a configuration of an ion source according to some embodiments.
Figure 2:
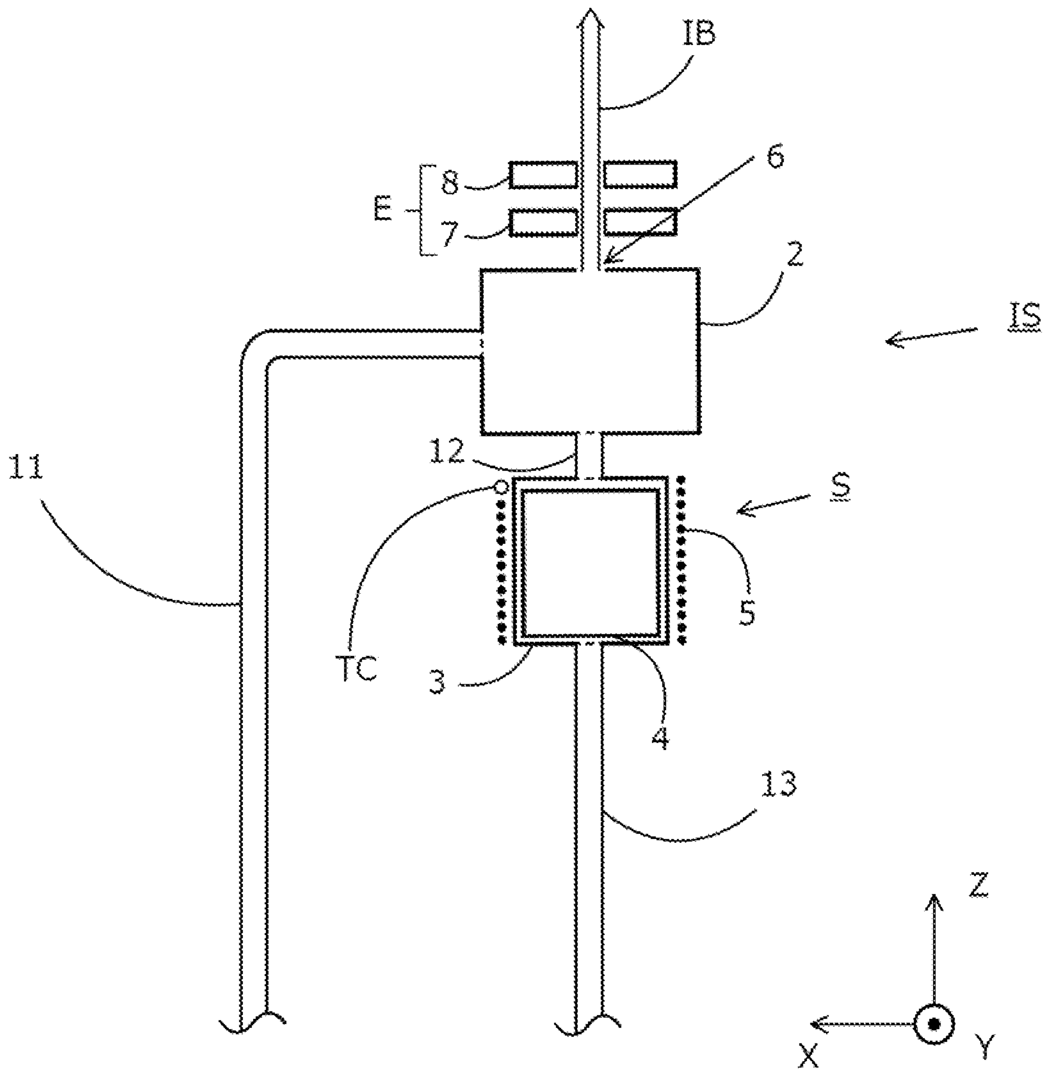
FIG. 2 is a schematic cross-sectional diagram showing a configuration of the ion source from another viewpoint, according to some embodiments.

FIG. 1 is a schematic cross-sectional view of the ion source IS, according to some embodiments. FIG. 2 is a schematic cross-sectional view of the ion source IS of FIG. 1 viewed from another plane.

The ion source IS may include a plasma chamber 2 that generates a plasma P inside, an extraction electrode E that extracts ion beams IB from the plasma P generated inside the plasma chamber 2 through an ion extraction port 6 of the plasma chamber 2, a second gas supply line 11 that supplies a gas as a first source for the plasma P to the plasma chamber 2 and a vaporizer S that supplies a vapor V as a second source for the plasma P, to the plasma chamber 2.

The plasma chamber 2 is surrounded by a cathode that emits electrons to ionize a gas or vapor supplied thereto, a reflecting electrode that reflects electrons emitted from the cathode back to the cathode side, and a pair of electromagnets that generate a magnetic field in a direction in which the cathode and the reflecting electrode are opposite each other, but the cathode, the reflecting electrode, and the pair of electromagnets are omitted to simplify the figures.

The extraction electrode E comprises a suppression electrode 7 for preventing electrons from flowing into the plasma chamber 2 and a grounding electrode 8 for fixing a ground potential. A DC power supply, not shown in the figures, is connected between the plasma chamber 2 and the suppression electrode 7, with the plasma chamber 2 side being positive, and a potential difference between the plasma chamber 2 and the suppression electrode 7 causes the ion beam IB with positive charge to be extracted from the plasma P through the ion extraction port 6 of the plasma chamber 2.

The vaporizer S supplies a reactive gas that chemically reacts with a solid material 4 through the first gas supply line 13 to a crucible 3 in which the solid material 4 is installed, thereby generating reaction products on the surface of the solid material 4. The solid material may include, for example, pellets, powder, blocks, and various other shapes of material. The crucible 3 is then heated by a heater 5 to vaporize the generated reaction product to generate the vapor V.

To give a specific example, in some embodiments, the solid material 4 may be an aluminum-containing material such as pure aluminum or aluminum fluoride, and the reactive gas may be a halogen gas such as chlorine gas or fluorine gas.

When a first open/close valve 14 in the first gas supply line 13 is open, the reactive gas is supplied to the crucible 3 from a first gas supply bottle 16 through the first gas supply line 13. When the reactive gas is supplied to the crucible 3, a chemical reaction occurs between the reactive gas and the solid material 4, and reaction products are formed on the surface layer of the solid material 4. For example, if the reactive gas is chlorine gas and the solid material 4 is pure aluminum, aluminum chloride is formed on the surface of the pure aluminum as a reaction product. If the reactive gas is fluorine gas and the solid material 4 is pure aluminum, aluminum fluoride is formed on the surface layer of the pure aluminum as a reaction product.

A heater 5 (e.g., a coil heater, a sheet heater, etc.) for heating the crucible 3 and a thermocouple TC for measuring the temperature of the crucible 3 are arranged around the crucible 3. When the crucible 3 is heated above a threshold temperature by the heater 5, the reaction products formed on the surface portion of the solid material 4 are vaporized. The threshold temperature may be predetermined and in some embodiments may be set experimentally or preset in the ion source IS. The vapor V of the reaction products is then supplied to the plasma chamber 2 through the vapor supply line 12. The threshold temperature is the temperature at which vaporization of the reaction products is possible and is below a melting point of the solid material 4.

Specifically, if the reaction product is aluminum chloride, the temperature for vaporizing is about 180° C., although the temperature may vary depending on a degree of vacuum in the crucible 3. If the solid material 4 is pure aluminum, the melting temperature of pure aluminum is about 660° C. Under these conditions, the threshold temperature can be any temperature between about 200° C. and about 500° C. In some embodiments, the threshold temperature may be a temperature range rather than a specific temperature. For example, in the case that the solid material 4 is pure aluminum, the threshold temperature may be in the range of 300° C. to 400° C.

As described above, a second gas supply line 11 may be provided that supplies the gas to the plasma chamber 2 through a supply path separate from the vapor. The gas may be enclosed in a second gas supply bottle 17. When a second open/close valve 15 is opened, the gas is supplied to the plasma chamber 2 through the second gas supply line 11. At this time (i.e., when the gas is supplied to the plasma chamber 2), the first open/close valve 14 is closed and the supply of a reactive gas is stopped.

The opening and closing operations of the first and second open/close valves 14, 15 and the adjustment of the output of the heater 5 may be carried out by an operator of the ion implanter or by a controller C, shown in FIG. 1, to control each part of the ion source IS using control signals S1 to S3. In some embodiments, the controller C may include hardware control logic coded to produce the control signals S1 to S3 described further below. In some embodiments, the controller may include at least on memory storing program code and at least one processor that accesses the at least one memory and executes the program code to generate the control signals S1 to S3. Thus, the controller C may be configured control the first and second open/close valves 14, 15 and the heater 5.

Figure 3:
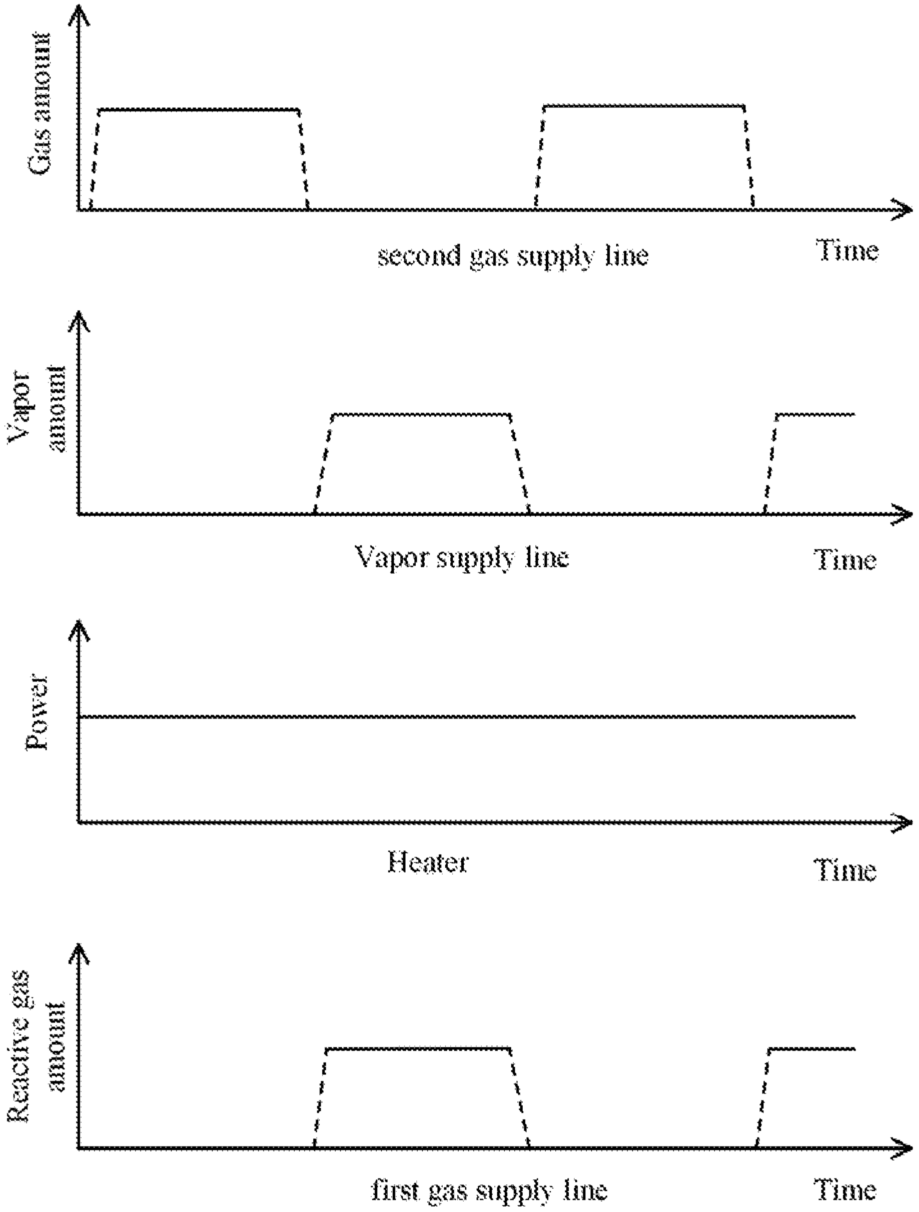
FIG. 3 illustrates an example of a control of each part of the ion source during switching of an ion species, according to some embodiments.
Figure 4:
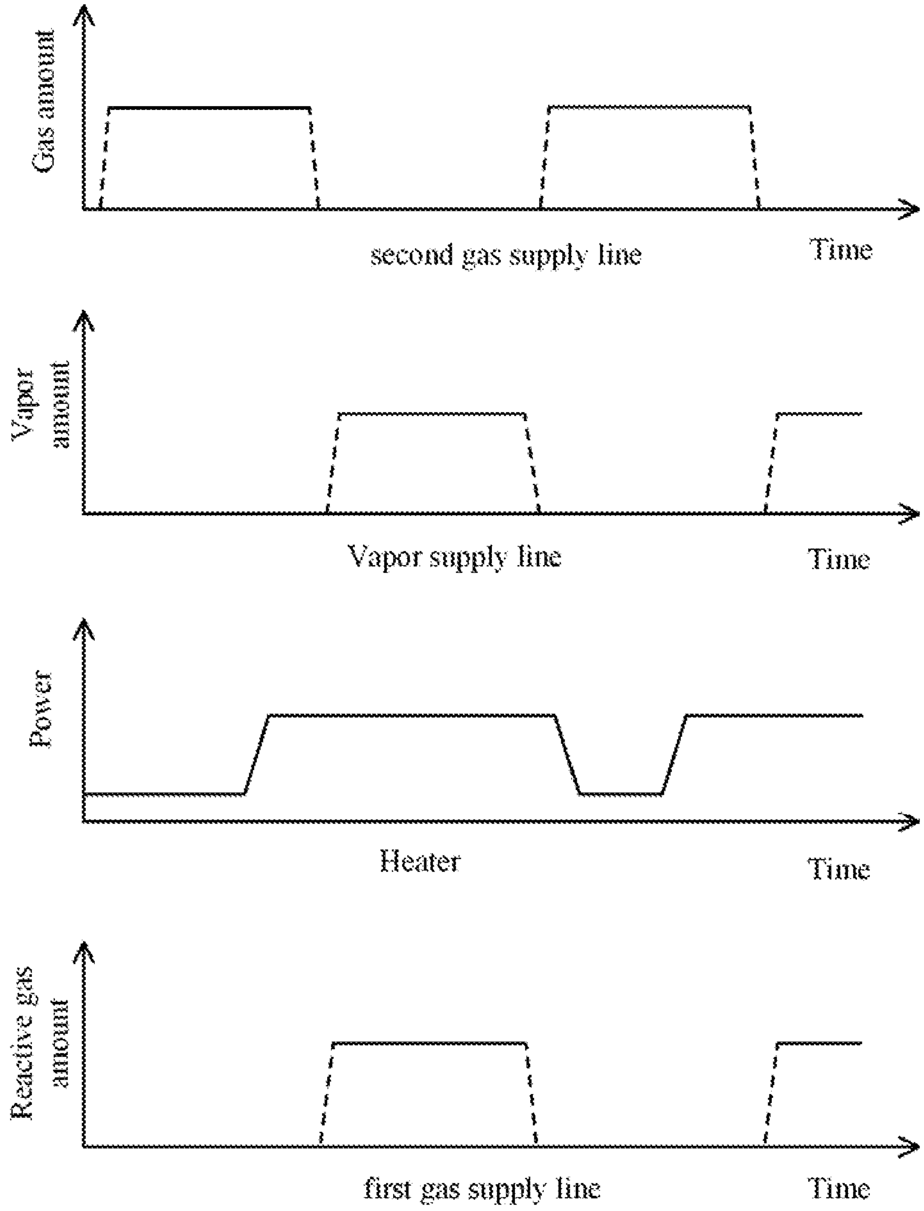
FIG. 4 illustrates an example of a control of each part of the ion source during switching of an ion species, according to some embodiments.
Figure 5:
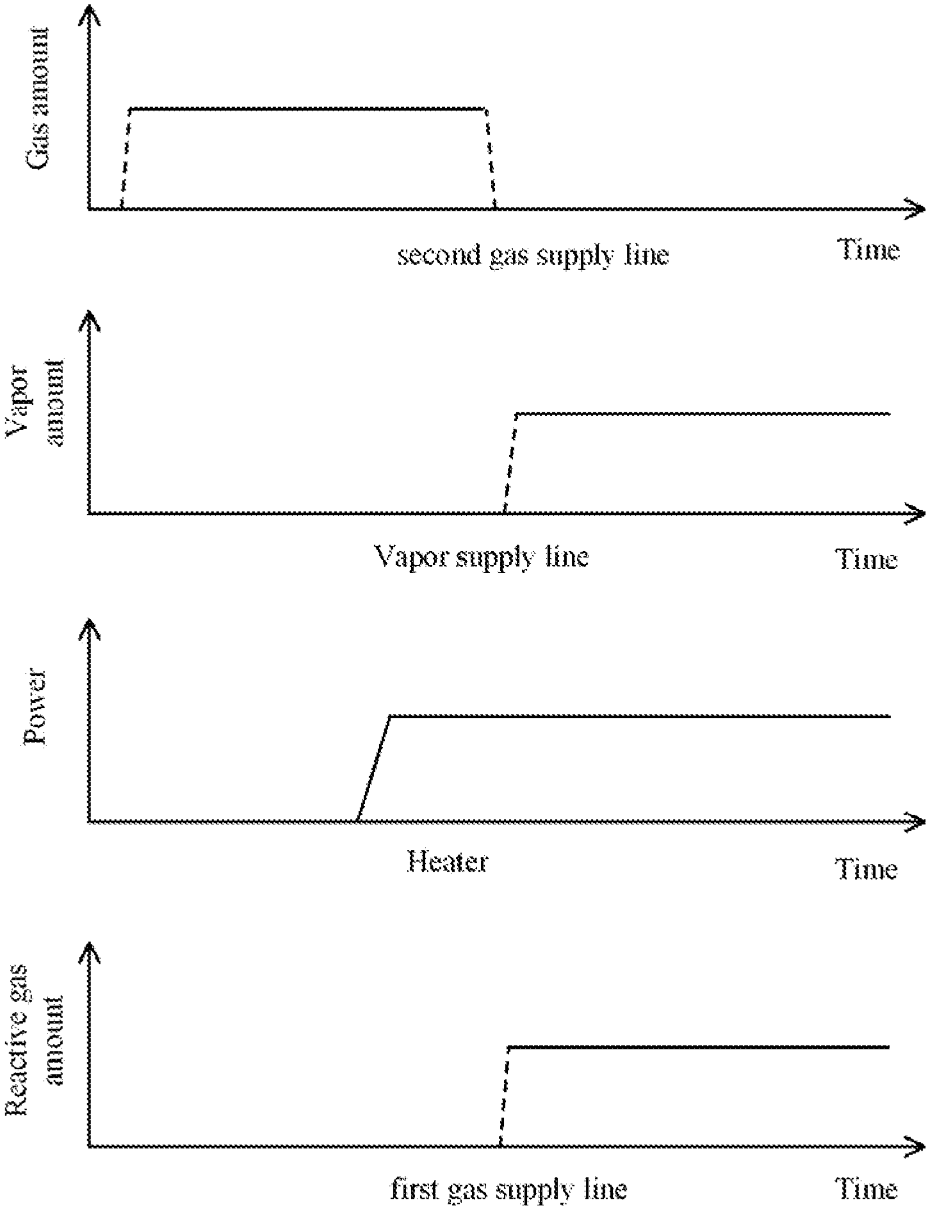
FIG. 5 illustrates an example of a control of each part of the ion source during switching of an ion species, according to some embodiments.

FIG. 3 through 5 illustrate various examples of a control of each part of the ion source during switching of an ion species, according to some embodiments. FIGS. 3 through 5 show the opening and closing operations of the first and second open/close valves 14 and 15 and the adjustment of the output power of the heater 5. Using FIGS. 3-5, the control of each part during the switching of ion species is explained below.

FIG. 3 through 5 show examples in which an ion beam is extracted from the gas-derived plasma to carry out an ion beam irradiation process for irradiating the irradiated object alternately with an ion beam extracted from the vapor-derived plasma to carry out an ion beam irradiation process for irradiating the irradiated object.

The horizontal axis of each graph in FIGS. 3-5 is time, and the time in each graph is coincident. The vertical axis of each graph is either one of amounts of gas or vapor in each feed line or an output power of the heater.

After the gas supply is stopped from the second gas supply line 11, vapor is supplied from the vaporizer S. In the vapor supply method according to various embodiments, the output control of the heater 5 is different from an output control of the related art technology.

In the vaporizer S, if the supply of the reactive gas through the first gas supply line 13 is stopped, no reaction products produced by the chemical reaction with the solid material 4 will be generated. If there are no reaction products, no vapor of reaction products will be produced even if the output of the heater 5 is maintained. Therefore, if the supply of the reactive gas is controlled, the vapor supply to the plasma chamber 2 can be controlled.

When comparing a time required to adjust the temperature of crucible 3 and a time required to control the on/off of the gas supply in switching the ion species, the former is longer than the latter. According to various embodiments, a switching time of the ion species can be shortened compared to a related art configuration because the switching of ion species only requires controlling the switching of the reactive gas from the first gas supply line 13 and the gas from the second gas supply line 11.

In FIG. 3, the power output of the heater 5 is constant. If the power output is constant, temperature control of the heater 5 according to the switching of ion species is not necessary, which simplifies the control.

If power consumption of the heater 5 and deterioration due to long-term use are to be considered, in some embodiments, the power output of the heater 5 may be kept low while the gas is supplied from the second gas supply line 11 to the plasma chamber 2, as shown in FIG. 4, and shortly before the switching of ion species is performed, the power output of the heater 5 may be switched to a higher power output for the vapor supply. This configuration reduces the power consumption of the heater 5 and reduces deterioration caused by long-term use of the heater at high output.

If the gas is supplied from the second gas supply line 11 to the plasma chamber 2 for a long period of time, according to some embodiments, the power output of the heater 5 may be set to zero, and shortly before the switching of ion species is implemented, the power output of the heater 5 may be switched to a power output for vapor supply.

In FIGS. 4 and 5, the crucible 3 is heated by the heater 5 while the gas is being supplied from the second gas supply line 11 to the plasma chamber 2, which reduces a time for switching ion species compared to a related art configuration.

In some embodiments, the solid material 4 in FIG. 1 may be about half the size of crucible 3 (i.e., the solid material 4 may fill the crucible only half way). However, embodiments are not limited thereto and, in some embodiments, the solid material 4 may fill an interior space of the crucible 3.

The ion source IS can be used in a variety of ion beam irradiation devices that use ion beams to process irradiated materials. Examples of ion beam irradiation devices other than ion implanters include ion beam etching devices and surface modification devices using ion beams.

It should be understood that the present disclosure is not limited to the above embodiments, but various other changes and modifications may be made therein without departing from the spirit and scope thereof as set forth in appended claims.

What is claimed is:

1. An ion source comprising:

a vaporizer which produces a reaction product by supplying, through a first gas supply line to a crucible in which a solid material is installed, a reactive gas that reacts with the solid material, and which vaporizes the reaction product by heating the crucible with a heater;

a plasma chamber to which a vapor is supplied from the vaporizer through a vapor supply line, a second gas supply line being connected to the plasma chamber separately from the vapor supply line; and a controller that is configured to control the heater to heat the crucible while a gas is being supplied from the second gas supply line to the plasma chamber and to stop a supply of the reactive gas through the first gas supply line to the crucible.

2. The ion source as recited in claim 1, wherein the controller controls the heater to heat the crucible such that a power output of the heater is constant.

3. The ion source as recited in claim 1, wherein the controller controls the heater to switch a power output of the heater from a first power level to a second power level at which the reaction product will be vaporized.

4. The ion source as recited in claim 3, wherein the first power level is lower than the second power level.

5. The ion source as recited in claim 4, wherein the first power level is zero.

6. The ion source as recited in claim 4, wherein the first power level is greater than zero.

7. An ion source comprising:

a vaporizer including a crucible containing a solid material which reacts with a reactive gas to produce a reaction product which, when heated, generates a vapor;

a heater configured to heat the crucible;

a plasma chamber communicatively connected to the vaporizer by a vapor supply line and configured to generate a plasma from the vapor or from a source gas supplied thereto;

a source gas supply line communicatively connected to the plasma chamber and through which the source gas is supplied to the plasma chamber;

a reactive gas supply line communicatively connected to the vaporizer through which the reactive gas is supplied to the vaporizer; and a controller that is configured to control the heater to heat the crucible while supplying the source gas to the plasma chamber through the source gas supply line, and to switch a source of the plasma from the vapor to the source gas by stopping the reactive gas from being supplied through the reactive gas supply line to the crucible.

8. The ion source as recited in claim 7, wherein the controller controls the heater to heat the crucible such that a power output of the heater is constant while the source gas is supplied to the plasma chamber.

9. The ion source as recited in claim 7, wherein the controller is further configured to switch the source of the plasma from the source gas to the vapor by controlling the heater to heat the crucible such that a power output of the heater is switched, while the source gas is being supplied to the plasma chamber through the source gas supply line, to a power level for at which the reaction product will be vaporized.

10. The ion source as recited in claim 7, wherein the controller is further configured to switch the source of the plasma from the source gas to the vapor by controlling the heater to heat the crucible such that a power output of the heater is switched, while the source gas is being supplied to the plasma chamber from the source gas supply line, from a first power level at which the reaction product will not be vaporized to a second power level at which the reaction product will be vaporized.

11. The ion source as recited in claim 10, wherein the first power level is lower than the second power level.

12. The ion source as recited in claim 11, wherein the first power level is zero.

13. The ion source as recited in claim 11, wherein the first power level is greater than zero.

* * * * *